US012727108B2

(12) United States Patent
Wu et al.

(10) Patent No.: US 12,727,108 B2
(45) Date of Patent: Sep. 1, 2026

(54) JOINT MODULE AND COMPUTING DEVICE

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 373 days.

(21) Appl. No.: 18/588,193

(22) Filed: Feb. 27, 2024

(65) Prior Publication Data

US 2024/0414872 A1 Dec. 12, 2024

(30) Foreign Application Priority Data

Jun. 6, 2023 (CN) ........................ 202310665278.X

(51) Int. Cl.
*H05K 7/14* (2006.01)
*H05K 7/20* (2006.01)

(52) U.S. Cl.
CPC ....... *H05K 7/1489* (2013.01); *H05K 7/20772* (2013.01)

(58) Field of Classification Search
CPC ............. H05K 7/1489; H05K 7/20772; H05K 7/20272; F16L 27/02; H01R 13/73; H01R 13/62; H01R 13/6315; H01R 24/00; H01R 35/00; G06F 1/16
USPC .................................................. 439/246–248
See application file for complete search history.

(56) References Cited

U.S. PATENT DOCUMENTS

| | | | | |
|---|---|---|---|---|
| 6,558,177 B2 * | 5/2003 | Havener | H01R 24/50 | 439/246 |
| 6,790,046 B2 * | 9/2004 | Haffenden | H01R 13/6315 | 439/669 |
| 6,863,538 B2 * | 3/2005 | Mattern | B60D 1/62 | 439/35 |
| 7,258,559 B2 * | 8/2007 | Mattern | H01R 13/6315 | 439/35 |
| 8,622,762 B2 * | 1/2014 | Van Swearingen | H01R 24/38 | 439/950 |
| 2004/0038557 A1 * | 2/2004 | Mattern | B60D 1/64 | 439/35 |

(Continued)

FOREIGN PATENT DOCUMENTS

WO 2022199334 9/2022

*Primary Examiner* — Tulsidas C Patel
*Assistant Examiner* — Thomas K Quigley
(74) *Attorney, Agent, or Firm* — ScienBiziP, P.C.

(57) ABSTRACT

A joint module for offsetting manufacturing tolerance comprises an outer joint support, a middle joint support, an inner joint support, a plug connector, and a reset component. The middle joint support is rotatably and movably connected to the outer joint support along a first axis. The inner joint support is rotatable and movable connected to the middle joint support along a second axis. The plug connector is connected to the inner joint support. The reset component is placed between the outer joint support, the middle joint support, and the inner joint support to reset the middle joint support and the inner joint support. When the joint module is reset, a third axis of the plug connector is perpendicular to the first axis and the second axis, the plug connector moves along the third axis to connect a plug. A computing device with the joint module is also disclosed.

20 Claims, 8 Drawing Sheets

(56) References Cited

U.S. PATENT DOCUMENTS

2006/0194464 A1 * 8/2006 Moreno .................... B25F 5/00
439/248
2006/0194465 A1 * 8/2006 Czikora ............... H01R 24/542
439/248
2006/0240695 A1 * 10/2006 Mattern ............. H01R 13/6315
439/247
2009/0137145 A1 * 5/2009 Arts ..................... H01R 13/748
439/578
2009/0317999 A1 * 12/2009 Arts ..................... H01R 13/748
439/248
2010/0210129 A1 * 8/2010 Arts ..................... H01R 13/748
439/248
2011/0250773 A1 * 10/2011 Hamner ............... H01R 12/724
439/248
2019/0319416 A1 * 10/2019 Zhang .................. H01R 35/025

* cited by examiner

JOINT MODULE AND COMPUTING DEVICE

FIELD

The disclosure herein generally relates to information computing systems, and more particularly relates to a joint module and a computing device.

BACKGROUND

When a server is installed in a rack, a plug connector behind the server needs to be connected to a plug on the rack, so that the rack can provide coolant to the server to cool the server. However, due to tolerances in the manufacturing process, the plug connector of the server and the plug of the rack are sometimes misaligned, resulting in the plug connector of the server and the plug of the rack being unable to connect.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
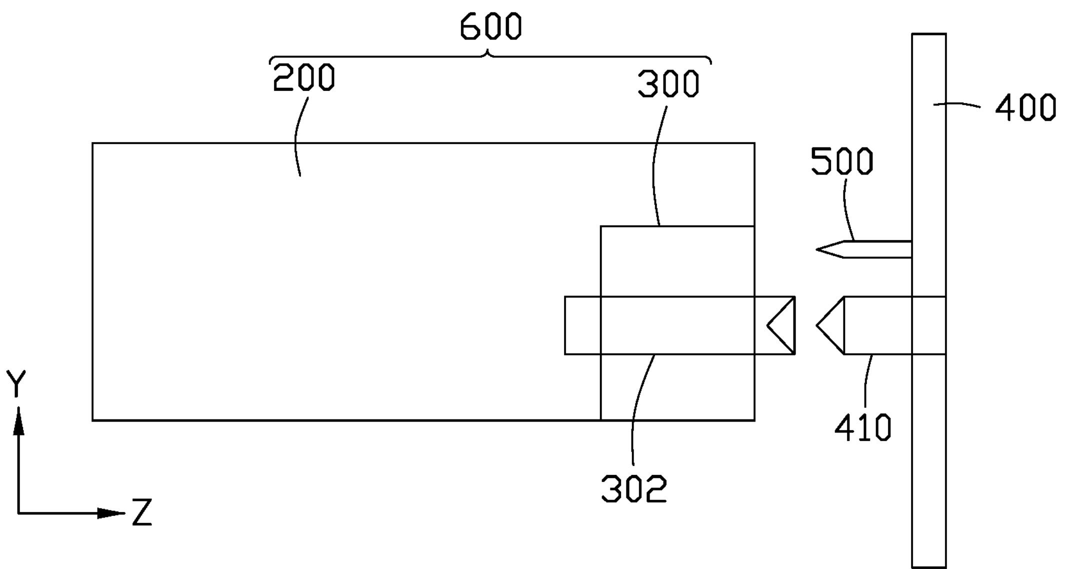
FIG. 1 is a diagram view of an embodiment of a computing device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 8, a computing device 100 in an embodiment includes a rack 400 and a plurality of servers 600. The plurality of servers 600 can be installed into the rack 400 in layers. The rack 400 includes a plurality of plugs 410, and there is at least one plug 410 in each layer. Each server 600 has a plug connector 302 in the back. When one of the plurality of servers 600 is installed into the rack 400, the plug connector 302 needs to be connected to the plug 410 in the same layer, so that the rack 400 can provide coolant to the server 600 to cool the server 600. Usually, there are two plugs 410 in each layer in the rack 400, and there are two plug connectors 302 in the back of each server 600, when the server 600 is installed into the rack 400, the two plug connectors 302 are connected to the two plugs 410 one-to-one, so that the coolant can be circulated between the server 600 and the rack 400.

The rack 400 further includes a guiding pin 500 in each layer. Each server 600 has a guiding hole (not shown in FIGs) in the back. When a server 600 is installed into the rack 400, the guiding pin 500 is inserted into the guiding hole to guide the movement of the server 600. Normally, when guiding pin 500 is aligned with the guiding hole, the plug connector 302 should be aligned with the plug 410, to ensure that the server 600 is installed properly.

However, sometimes when guiding pin 500 is aligned with the guiding hole, the plug connector 302 is not aligned with the plug 410 due to manufacturing tolerances for example, resulting in the plug connector 302 being unable to connect the plug 410.

Figure 2:
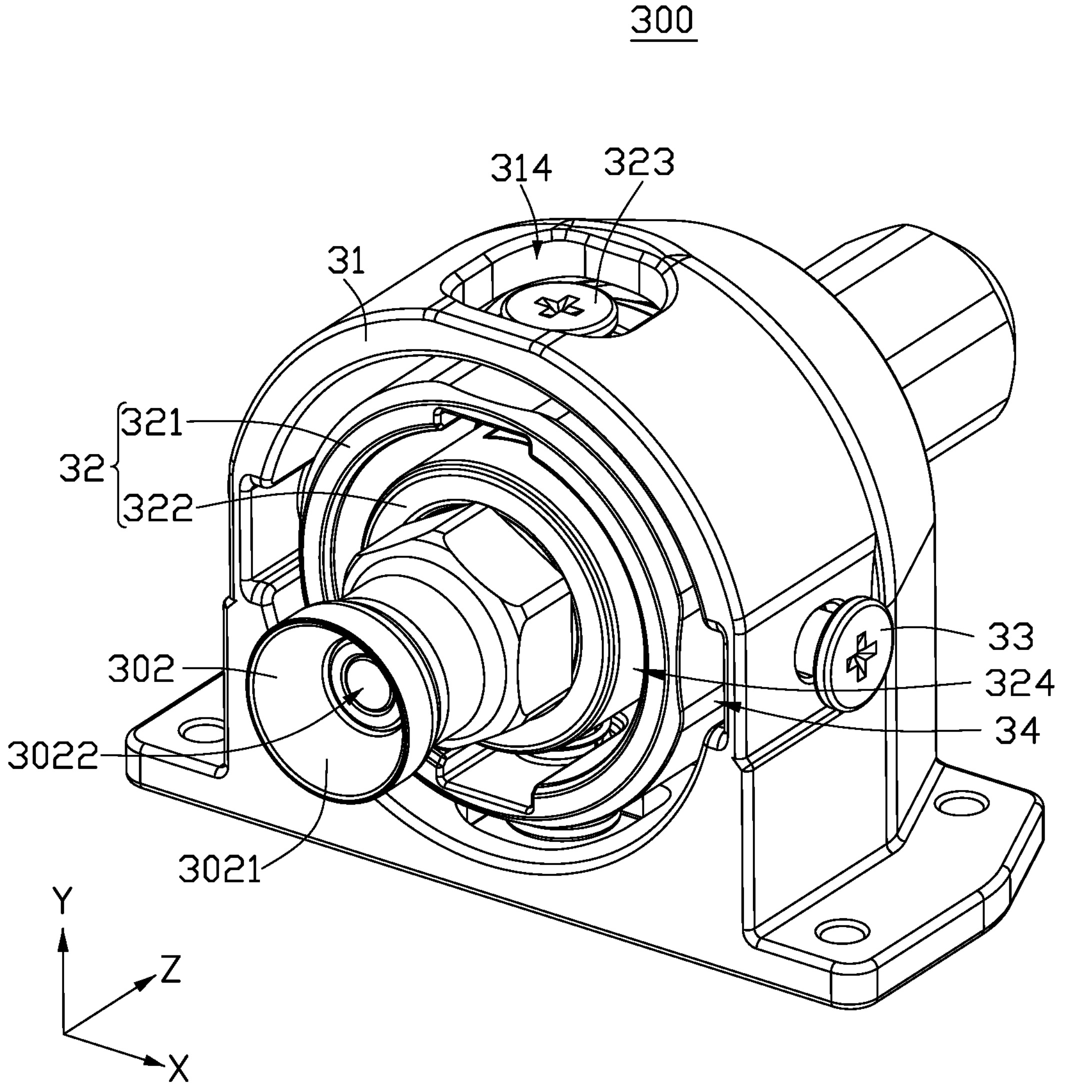
FIG. 2 is an isometric view of an embodiment of a joint module according to the present disclosure.
Figure 3:
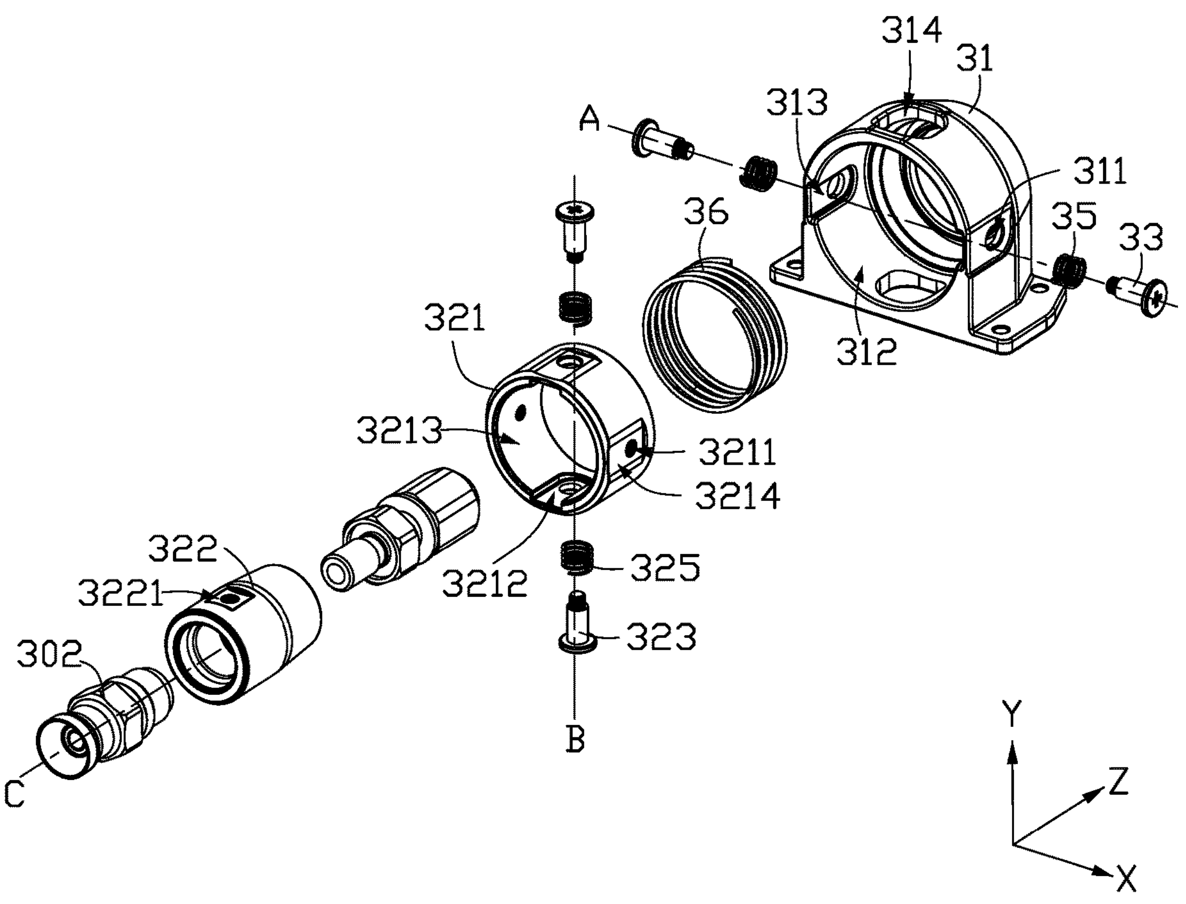
FIG. 3 is an explored view of the joint module shown in FIG. 2.

As shown in FIG. 1 to FIG. 3, in some embodiments, to solve the problem mentioned above, the computing device 100 includes a chassis 200 and a joint module 300, and the joint module 300 is located on the chassis 200. The joint module 300 includes an outer joint support 31, a middle joint support 321, an inner joint support 322, the plug connector 302, and a reset component. The outer joint support 31 is fixed to the chassis 200. The middle joint support 321 connected to the outer joint support 31. The middle joint support 321 is rotatable around a first axis A and is movable along the first axis A relative to the outer joint support 31, and the first axis A is parallel to a direction X. The inner joint support 322 is connected to the middle joint support 321, and the inner joint support 322 is rotatable around a second axis B and is movable along the second axis B relative to the middle joint support 321, and the second axis B is parallel to a direction Y. The second axis B is substantially perpendicular to the first axis A. The plug connector 302 is fixed to the inner joint support 322 and the plug connector 302. The reset component is placed between the outer joint support 31 and the middle joint support 321, and the reset component is also placed between the middle joint support 321 and the inner joint support 322. The reset component is used to reset the middle joint support 321 and the inner joint support 322, so that a third axis C of the plug connector 302 is substantially perpendicular to the first axis A and the second axis B, and the third axis C is parallel to a direction Z, for preparing for the next attachment of the plug 410 and the plug connector 302. When a server 600 is installed into the rack 400, the server 600 moves along the direction Z, the plug connector 302 moves along the third axis C, if the plug 410 is aligned with the plug connector 302, the plug connector 302 will connect the plug 410 smoothly; if the plug 410 is not aligned with the plug connector 302, because the plug connector 302 can rotate around the axis A and B and move along the axis A and B, the plug 410 will rotate and move the plug connector 302 when contact the plug connector 302, to force the plug connector 302 to be aligned with the plug 410, so that the plug connector 302 is able to connect the plug 410 properly, realizing a function of auto-calibration.

Figure 4:
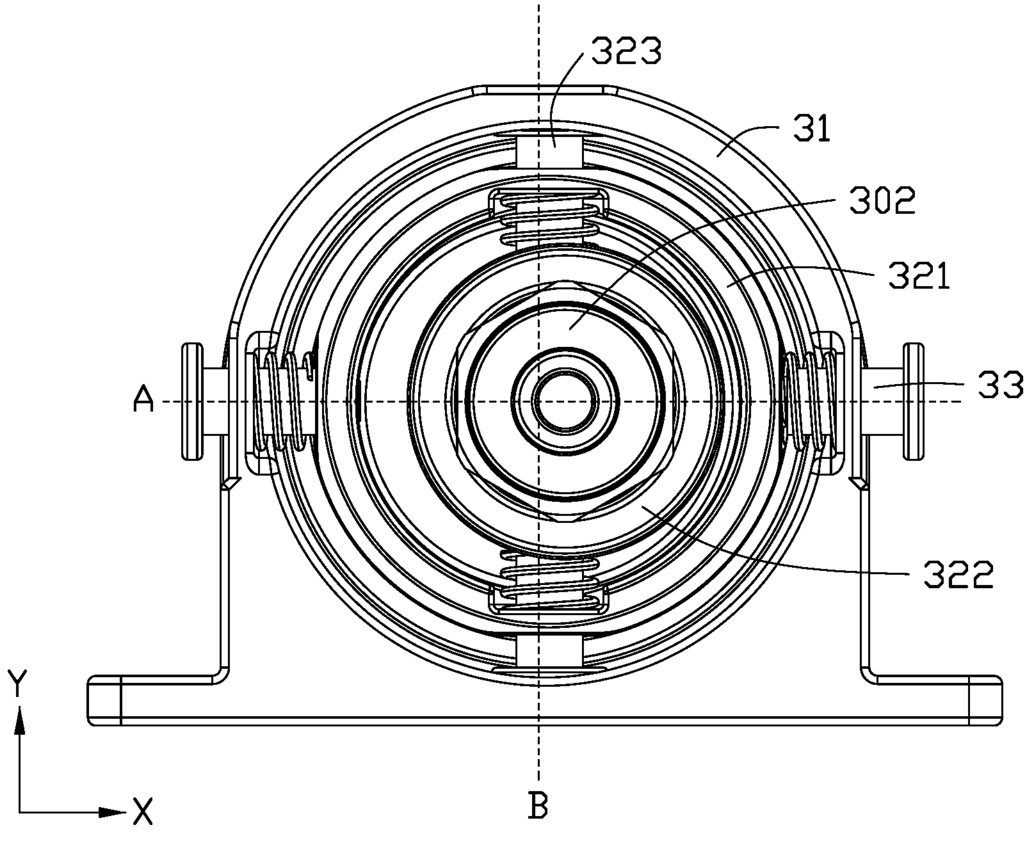
FIG. 4 is a front view of the joint module shown in FIG. 2 showing a plug connector is moved to a right of a first axis.

In some embodiments, if the plug connector 302 does not need to rotate around the axis B or move along the axis B, only need to rotate around the axis A or move along the axis A, as shown in FIG. 4, to simplify the structure, the middle joint support 321 and the inner joint support 322 can be combined to a combined part 32, which means the inner joint support 322 cannot move or rotate relative to the middle joint support 321. The plug connector 302 is fixed on the combined part 32, so the plug connector 302 is only rotatable around the first axis A and is movable along the first axis A relative to the outer joint support 31.

In some embodiments, the outer joint support 31 has a first cavity 312, the middle joint support 321 is placed in the first cavity 312. A first floating gap 34 is defined between the middle joint support 321 and the outer joint support 31, so that the middle joint support 321 has space to move and rotate relative to the outer joint support 31 in the first cavity 312. The outer joint support 31 defines two first holes 311 along the first axis A. The joint module 300 further includes two first shafts 33 extended along the first axis A, and each of the two first shafts 33 passes through each of the two first holes 311 and connects with the middle joint support 321. The two first shafts 33 are slidable and rotatable in the two first holes 311, so that the middle joint support 321 is movable and rotatable relative to the outer joint support 31.

In some embodiments, as shown in FIG. 3, the middle joint support 321 is a ring and forms a second cavity 3213 in the hollow center. The inner joint support 322 is placed in the second cavity 3213. A second floating gap 324 is defined between the middle joint support 321 and the inner joint support 322. The middle joint support 321 defines two second holes 3211 along the second axis B, the joint module 300 further includes two second shafts 323 extended along the second axis B. Each of the two second shafts 323 passes through each of the two second holes 3211 and connects with the inner joint support 322. The two second shafts 323 is slidable and rotatable in the two second holes 3211, so that the inner joint support 322 is movable and rotatable relative to the middle joint support 321.

In some embodiments, the reset component includes two first springs 35. The two first springs 35 are placed between the outer joint support 31 and the middle joint support 321. Each of the two first springs 35 is set around each of the two first shafts 33. The two first springs 35 are used to reset the middle joint support 321 along the first axis A, specifically, as shown in FIG. 4, if the middle joint support 321 is only moved along the axis A to the right after the plug 410 is inserted into the plug connector 302, the first spring in the right is compressed, and when the server 600 is removed from the rack 400, the plug 410 is pulled out from the plug connector 302, the first spring 35 in the right will push the middle joint support 321 to the left, so to reset the middle joint support 321.

Figure 7:
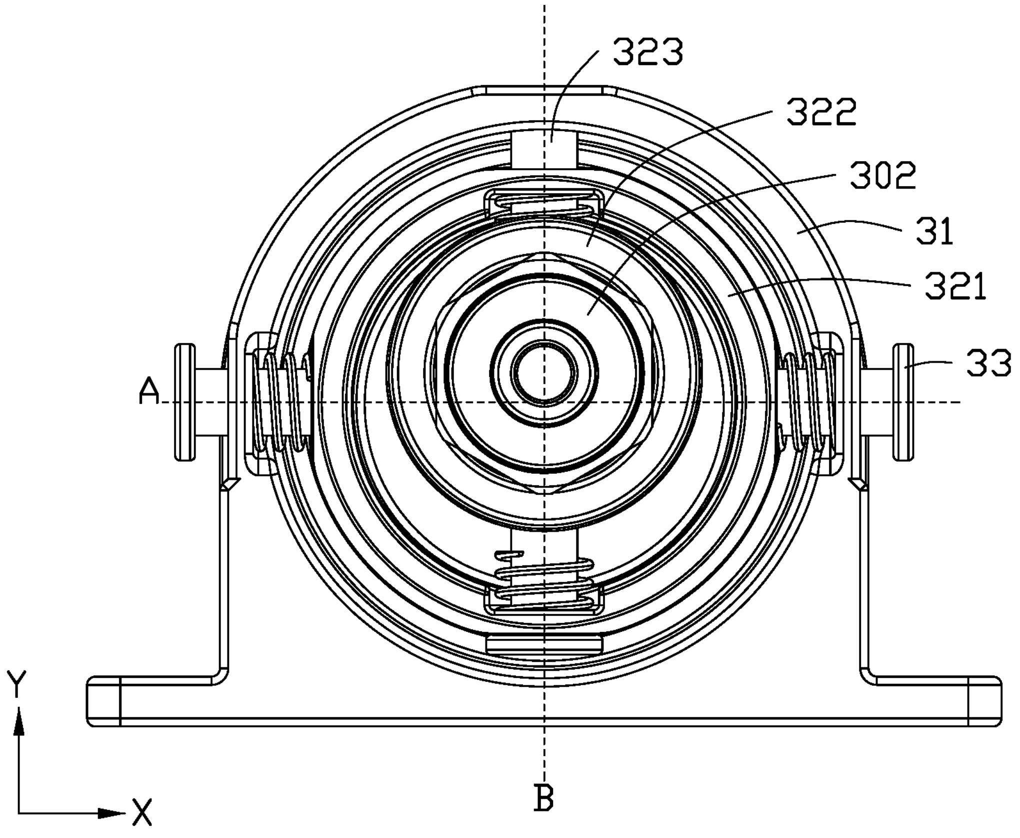
FIG. 7 is a front view of the joint module shown in FIG. 2, showing a plug connector is moved up along a second axis.

In some embodiments, the reset component further includes two second springs 325. The two second springs 325 are placed between the middle joint support 321 and the inner joint support 322. Each of the two second springs 325 is set around each of the two second shafts 323. The two second springs 325 are used to reset the inner joint support 322 along the second axis B, specifically, as shown in FIG. 7, if the inner joint support 322 is only moved up along the axis B after the plug 410 is inserted into the plug connector 302, the second spring 325 on the top is compressed, and when the server 600 is removed from the rack 400, the plug 410 is pulled out from the plug connector 302, the second spring 325 on the top will push the inner joint support 322 down, so to reset the inner joint support 322.

Figure 5:
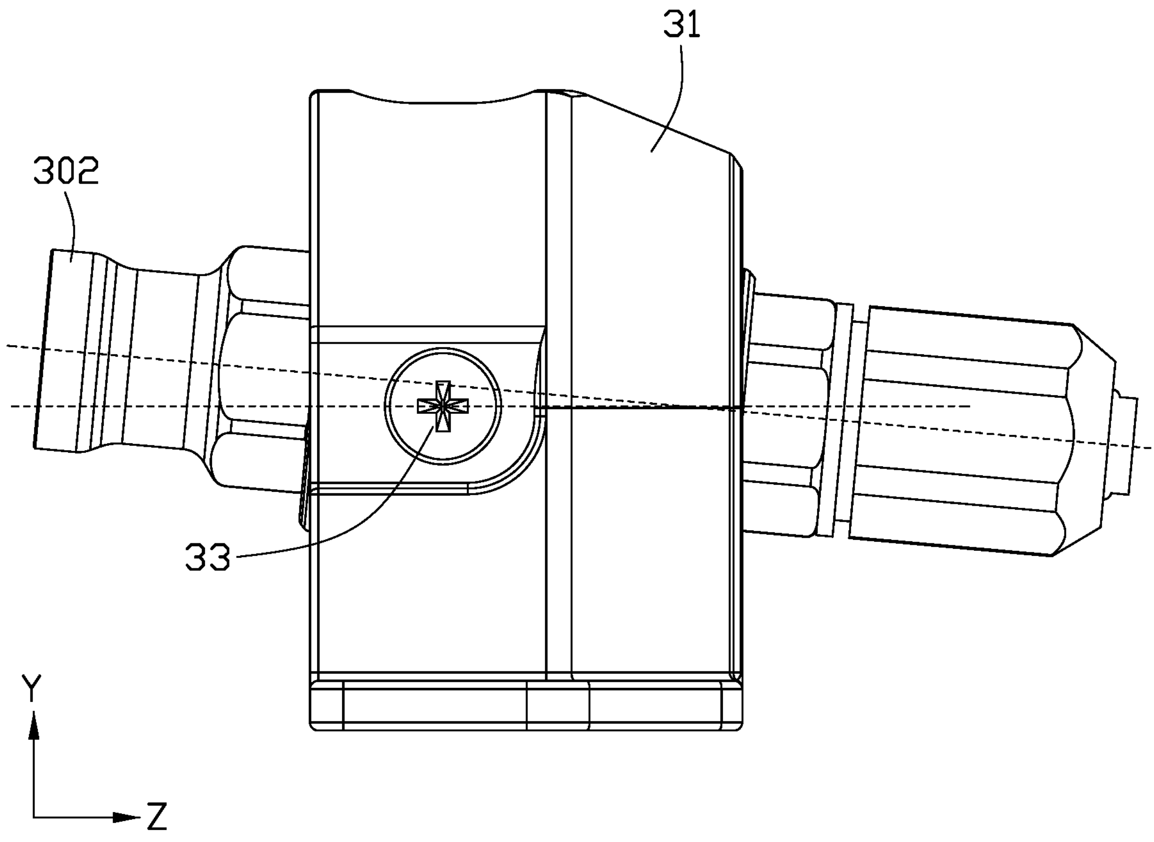
FIG. 5 is a side view of the joint module shown in FIG. 2, showing a plug connector is rotated up around a first axis.

In some embodiments, the reset component further includes a third spring 36, the third spring 36 is placed between the middle joint support 321 and the outer joint support 31. The third spring 36 is used to reset the middle joint support 321, specifically, as shown in FIG. 5, if the middle joint support 321 is rotated up around the first axis A after the plug 410 is inserted into the plug connector 302, the third spring 36 is compressed, and when the server 600 is removed from the rack 400, the plug 410 is pulled out from the plug connector 302, the third spring 36 will push the middle joint support 321 rotate down around the axis A, so to reset the middle joint support 321.

Figure 6:
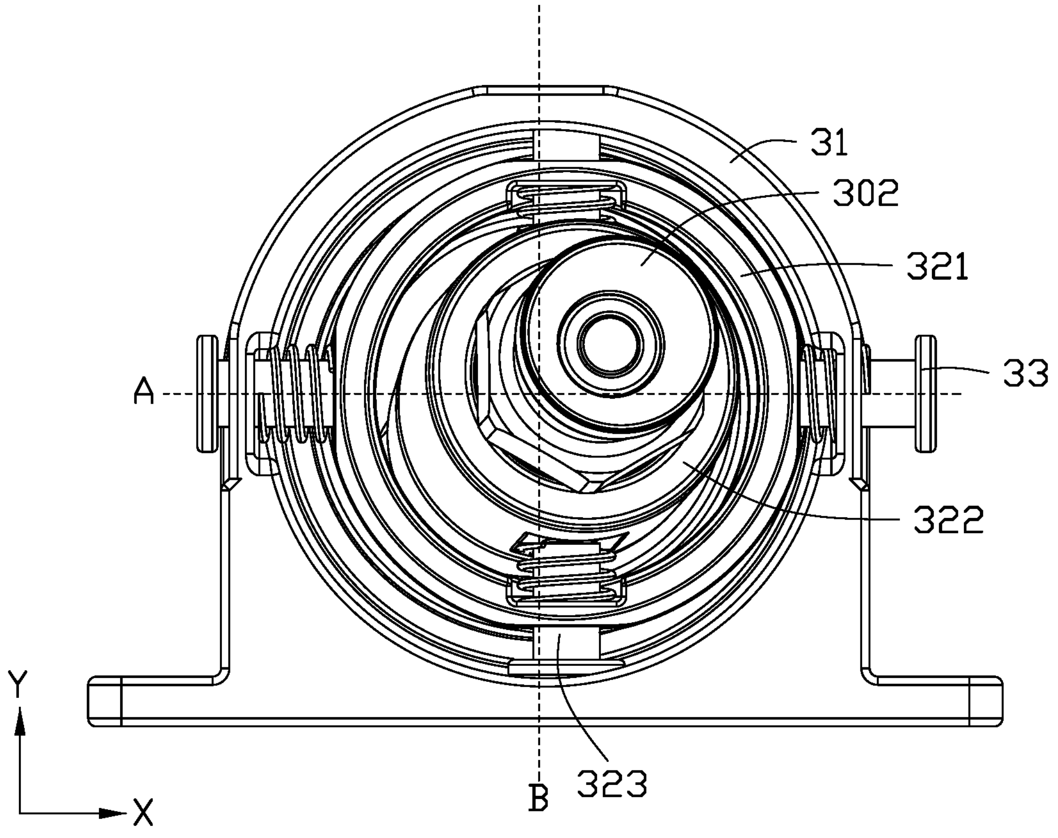
FIG. 6 is a front view of the joint module shown in FIG. 2, showing a plug connector is rotated up around a first axis, moved to a right of the first axis, and rotated to a right around a second axis.

As shown in FIG. 6, in actual use of the joint module 300, the plug connector 302 will most likely look like what is shown in FIG. 6, after the plug 410 is inserted into the plug connector 302, the middle joint support 321 is moved to the right along the first axis A and is rotated up around the first axis A, the inner joint support 322 is rotated to the right around the second axis B and may be moved up along the second axis B.

Figure 8:
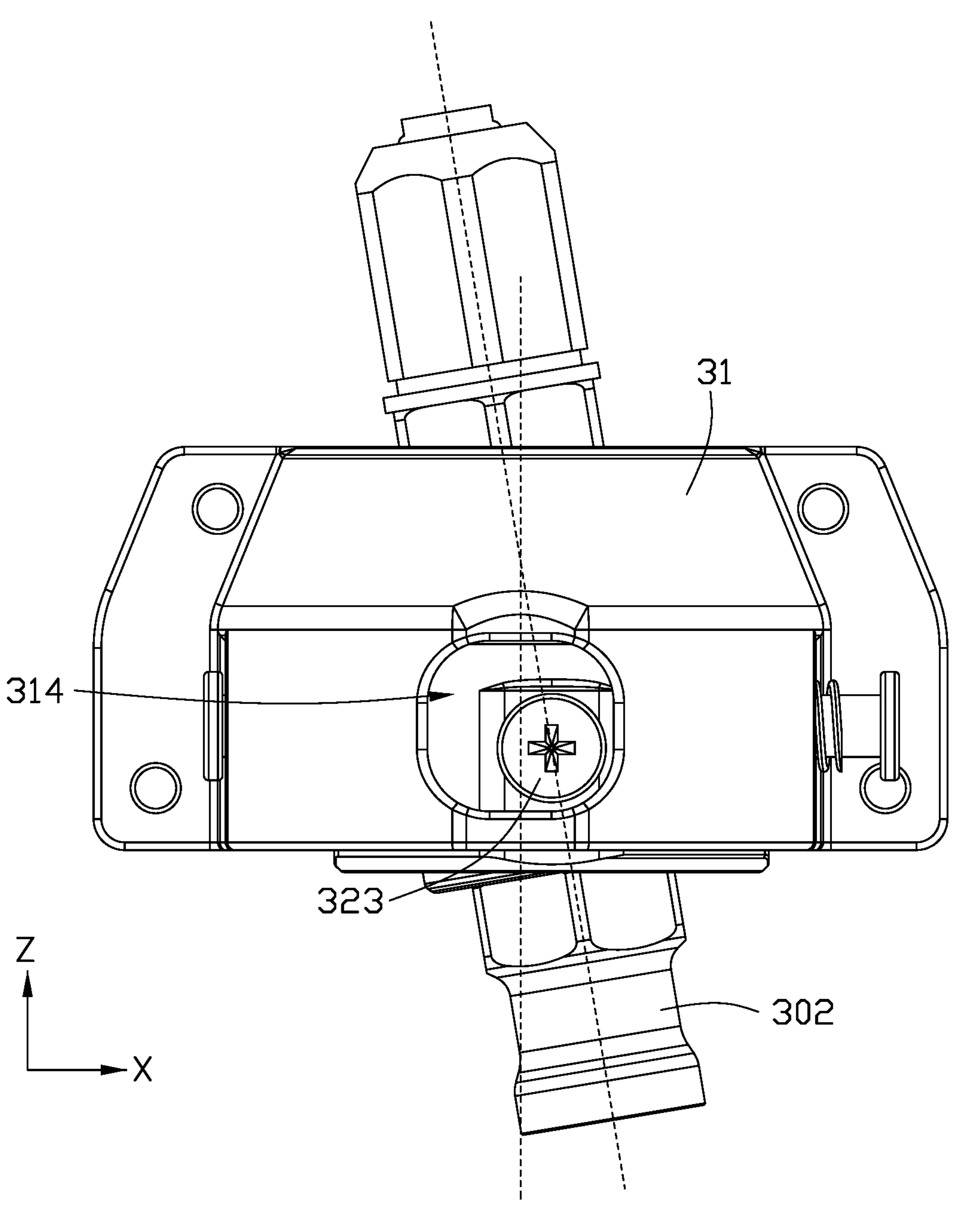
FIG. 8 is a top view of the joint module shown in FIG. 2, showing a plug connector is rotated to a right of a second axis and moved to a right of a first axis.

In some embodiments, the reset component further includes a fourth spring (not shown in FIGs), the fourth spring is placed between the middle joint support 321 and the inner joint support 322. The fourth spring is used to reset the inner joint support 322, specifically, as shown in FIG. 8, if the inner joint support 322 is rotated to the right around the axis B, the fourth spring is compressed, and when the server 600 is removed from the rack 400, the plug 410 is pulled out from the plug connector 302, the fourth spring will push the inner joint support 322 rotate left around the axis B, so to reset the inner joint support 322.

In some embodiments, the outer joint support 31 has two first slots 313 arranged along the first axis A in the first cavity 312, and each of the two first springs 35 is placed in each of the two first slots 313.

In some embodiments, the inner joint support 322 has two second slots 3212 arranged along the second axis B in the second cavity 3213, and each of the two second springs 325 is placed in each of the two second slots 3212.

In some embodiments, the two first slot 313 run through a surface of the outer joint support 31 along a direction parallel to the third axis C, and it is easier to put the first spring 35 into the first slot 313 when assembling the joint module 300.

In some embodiments, the two second slot 3212 run through a surface of the middle joint support 321 along a direction parallel to the third axis C, and it is easier to put the second spring 325 into the second slot 3212 when assembling the joint module 300.

In some embodiments, the middle joint support 321 defines two third slots 3214 arranged along the first axis A, each of the two third slots 3214 is connected to each of the two first slots 313, each third slot 3214 and each first slot 313 are used to together contain one first spring 35, which makes it easier to assemble the first springs 35.

In some embodiments, the inner joint support 322 defines two fourth slots 3221 arranged along the second axis B, each of the two fourth slots 3221 is connected to each of the two second slots 3212, each fourth slot 3221 and each second slot 3212 are used to together contain one second spring 325, which makes it easier to assemble the second springs 325.

In some embodiments, the outer joint support 31 has two avoiding holes 314 arranged in the direction Y. Each of the two avoiding holes 314 is used to avoid each of the two second shafts 323 from contacting the outer joint support 31, so the two second shafts 323 cannot contact the outer joint support 31, preventing the outer joint support 31 from interfering with the two second shafts 323.

In some embodiments, as shown in FIG. 2, the plug connector 302 defines a pipe hole 3021 and a funnel surface 3022, the funnel surface 3022 is used to guide the plug 410 to insert into the pipe hole 3021, so the coolant can circulate in the server 600.

In some embodiments, the first axis A is a horizontal axis, the second axis B is vertical axis.

In some embodiments, the two first shafts 33 and the two second shaft 323 are screws.

In some embodiments, the maximum unilateral movement distance of the middle joint support 321 along the first axis A is 1.8 mm, so the total bilateral movement distance along the first axis A is 3.6 mm.

In some embodiments, the maximum unilateral rotation angle of the middle joint support 321 around the first axis A is 5°, so the total bilateral rotation angle around the first axis A is 10°.

In some embodiments, the maximum unilateral movement distance of the inner joint support 322 along the second axis B is 1.8 mm, so the total bilateral movement distance along the second axis B is 3.6 mm.

In some embodiments, the maximum unilateral rotation angle of the inner joint support 322 around the second axis B is 10°, so the total bilateral rotation angle around the second axis B is 20°.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A joint module comprising:

an outer joint support;

a middle joint support connected to the outer joint support, the middle joint support being rotatable around a first axis and being movable along the first axis relative to the outer joint support;

an inner joint support connected to the middle joint support, the inner joint support being rotatable around a second axis and being movable along the second axis relative to the middle joint support, the second axis being substantially perpendicular to the first axis;

a plug connector fixed to the inner joint support; and a reset component placed between the outer joint support, the middle joint support, and the inner joint support, the reset component being configured to reset the middle joint support and the inner joint support, wherein when the middle joint support and the inner joint support are reset, a third axis of the plug connector is substantially perpendicular to the first axis and the second axis.

2. The joint module of claim 1, wherein the outer joint support defines a first cavity, the middle joint support is placed in the first cavity, a first floating gap is defined between the outer joint support and the middle joint support, the outer joint support defines two first holes along the first axis, the joint module further comprises two first shafts extended along the first axis, each of the two first shafts extends through a corresponding first hole of the two first holes and connects with the middle joint support, each of the two first shafts is slidable and rotatable in the corresponding first hole.

3. The joint module of claim 2, wherein the outer joint support defines two first slots along the first axis in the first cavity, the reset component comprises two first springs, the two first springs are placed between the outer joint support and the middle joint support, each of the two first springs is set around a corresponding first shaft of the two first shafts and placed in a corresponding first slot of the two first slot, the two first springs are configured to reset the middle joint support along the first axis.

4. The joint module of claim 3, wherein the middle joint support defines a second cavity, the inner joint support is placed in the second cavity, a second floating gap is defined between the middle joint support and the inner joint support, the middle joint support defines two second holes along the second axis, the joint module further comprises two second shafts extended along the second axis, each of the two second shafts extends through a corresponding second hole of the two second holes and connects with the inner joint support, each of the two second shafts is slidable and rotatable in the corresponding second hole.

5. The joint module of claim 4, wherein the inner joint support defines two second slots along the second axis in the second cavity, the reset component further comprises two second springs, the two second springs are placed between the middle joint support and the inner joint support, each of the two second springs is set around a corresponding second shaft of the two second shafts and placed in a corresponding second slot of the two second slots, the two second springs are configured to reset the inner joint support along the second axis.

6. The joint module of claim 5, wherein each of the two first slots extend through a surface of the outer joint support along a direction parallel to the third axis, and each of the two second slots extends through a surface of the middle joint support along a direction parallel to the third axis.

7. The joint module of claim 6, wherein the middle joint support defines two third slots along the first axis, each of the two third slots is connected to a corresponding first slot of the two first slots, each of the two first spring is accommodated between the corresponding first slot and the corresponding third slot, the inner joint support defines two fourth slots along the second axis, each of the two fourth slots is connected to a corresponding second slot of the two second slots, each of the two second springs is accommodated between the corresponding second slot and the corresponding fourth slot.

8. The joint module of claim 4, wherein the outer joint support further defines two avoiding holes along the second axis, each of the two avoiding hole is configured to avoid a corresponding second shaft of the two second shafts from contacting the outer joint support.

9. The joint module of claim 5, wherein the reset component further comprises a third spring, the third spring is placed between the middle joint support and the outer joint support, the third spring is configured to offset a rotation of the middle joint support around the two first shafts.

10. The joint module of claim 1, wherein the plug connector defines a pipe hole and a funnel surface, the funnel surface is configured to guide a plug to be inserted into the pipe hole.

11. A computing device comprising:

a rack comprising a plurality of plugs;

a plurality of servers placed in the rack, each of the plurality of servers comprising:

a chassis; and a joint module located on the chassis, the joint module comprising:

an outer joint support;

a middle joint support connected to the outer joint support, the middle joint support being rotatable around a first axis and being movable along the first axis relative to the outer joint support;

an inner joint support connected to the middle joint support, the inner joint support being rotatable around a second axis and being movable along the second axis relative to the middle joint support, the second axis being substantially perpendicular to the first axis;

a plug connector fixed to the inner joint support, the plug connector being configured to connect one of the plurality of plugs; and a reset component placed between the outer joint support, the middle joint support, and the inner joint support, the reset component being configured to reset the middle joint support and the inner joint support, wherein when the middle joint support and the inner joint support are reset, a third axis of the plug connector is substantially perpendicular to the first axis and the second axis, the plug connector moves along the third axis to connect one of the plurality of plugs.

12. The joint module of claim 11, wherein the outer joint support defines a first cavity, the middle joint support is placed in the first cavity, a first floating gap is defined between the outer joint support and the middle joint support, the outer joint support defines two first holes along the first axis, the joint module further comprises two first shafts extended along the first axis, each of the two first shafts extends through a corresponding first hole of the two first holes and connects with the middle joint support, each of the two first shafts is slidable and rotatable in the corresponding first hole, the middle joint support is slidable along the two first shafts and rotatable around the two first shafts.

13. The joint module of claim 12, wherein the outer joint support defines two first slots along the first axis in the first cavity, the reset component comprises two first springs, the two first springs are placed between the outer joint support and the middle joint support, each of the two first springs is set around a corresponding first shaft of the two first shafts and placed in a corresponding first slot of the two first slots, the two first springs are configured to reset the middle joint support along the first axis.

14. The joint module of claim 13, wherein the middle joint support defines a second cavity, the inner joint support is placed in the second cavity, a second floating gap is defined between the middle joint support and the inner joint support, the middle joint support defines two second holes along the second axis, the joint module further comprises two second shafts extended along the second axis, each of the two second shafts extends through a corresponding second hole of the two second holes and connects with the inner joint support, each of the two second shafts is slidable and rotatable in the corresponding second hole, the inner joint support is slidable along the two second shafts and rotatable around the two second shafts.

15. The joint module of claim 14, wherein the inner joint support defines two second slots along the second axis in the second cavity, the reset component further comprises two second springs, the two second springs are placed between the middle joint support and the inner joint support, each of the two second springs is set around a corresponding second shaft of the two second shafts and placed in a corresponding second slot of the two second slots, the two second springs are configured to reset the inner joint support along the second axis.

16. The joint module of claim 15, wherein each of the two first slots extend through a surface of the outer joint support along a direction parallel to the third axis, and each of the two second slots extends through a surface of the middle joint support along a direction parallel to the third axis.

17. The joint module of claim 16, wherein the middle joint support defines two third slots along the first axis, each of the two third slots is connected to a corresponding first slot of the two first slots, each of the two first springs is accommodated between the corresponding first slot and the corresponding third slot, the inner joint support defines two fourth slots along the second axis, each of the two fourth slots is connected to a corresponding second slot of the two second slots, each of the two second springs is accommodated between the corresponding second slot and the corresponding fourth slot.

18. The joint module of claim 14, wherein the outer joint support further defines two avoiding holes along the second axis, each of the two avoiding hole is configured to avoid a corresponding second shaft of the two second shafts from contacting the outer joint support.

19. The joint module of claim 15, wherein the reset component further comprises a third spring, the third spring is placed between the middle joint support and the outer joint support, the third spring is configured to offset a rotation of the middle joint support around the two first shafts.

20. The joint module of claim 11, wherein the plug connector defines a pipe hole and a funnel surface, the funnel surface is configured to guiding the plug to be inserted into the pipe hole.

* * * * *